US006342941B1

(12) United States Patent
Nei et al.

(10) Patent No.: US 6,342,941 B1
(45) Date of Patent: Jan. 29, 2002

(54) EXPOSURE APPARATUS AND METHOD PREHEATING A MASK BEFORE EXPOSING; A CONVEYANCE METHOD PREHEATING A MASK BEFORE EXPOSING; AND A DEVICE MANUFACTURING SYSTEM AND METHOD MANUFACTURING A DEVICE ACCORDING TO THE EXPOSURE APPARATUS AND METHOD

(75) Inventors: Masahiro Nei; Kenichiro Kaneko, both of Kawasaki; Hiroki Tateno, Sakura; Jiro Inoue, Kawasaki; Naomasa Shiraishi, Urawa, all of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/505,143

(22) Filed: Feb. 15, 2000

Related U.S. Application Data

(63) Continuation-in-part of application No. 08/815,273, filed on Mar. 10, 1997, now abandoned, which is a continuation of application No. 08/995,809, filed on Dec. 22, 1997, now abandoned.

(30) Foreign Application Priority Data

| Mar. 11, 1996 | (JP) | ............................................. 8-082064 |
| Mar. 28, 1996 | (JP) | ............................................. 8-073622 |
| Dec. 24, 1996 | (JP) | ............................................. 8-343176 |
| Oct. 7, 1997 | (JP) | ............................................. 9-274876 |

(51) Int. Cl.$^7$ ........................ G03B 27/68; G03B 27/42; G03B 27/32
(52) U.S. Cl. .............................. 355/52; 355/53; 355/77
(58) Field of Search ............................. 355/30, 52, 53, 355/55, 71, 77; 356/399, 401, 400; 430/330, 5; 250/443.1, 316.1, 492.2

(56) References Cited

U.S. PATENT DOCUMENTS

| 4,720,732 A | * | 1/1988 | Tsutsui ........................ 355/30 |
| 4,800,251 A |   | 1/1989 | Matsuoka |
| 4,916,322 A |   | 4/1990 | Glavish et al. |
| 5,498,118 A |   | 3/1996 | Nakahara |
| 5,894,056 A | * | 4/1999 | Kakizaki et al. ............... 355/53 |

* cited by examiner

*Primary Examiner*—Russell Adams
*Assistant Examiner*—Peter B. Kim

(57) ABSTRACT

A method and apparatus for exposing an image of a pattern formed in a mask onto a sensitive substrate. The mask is irradiated with an irradiation light. Data is computed relating to the thermal expansion saturation point of the mask due to absorption of the irradiation light. The mask is expanded to the thermal expansion saturation point based on the computed data, and the image of the mask pattern is exposed onto the sensitive substrate.

41 Claims, 7 Drawing Sheets

EXPOSURE APPARATUS AND METHOD PREHEATING A MASK BEFORE EXPOSING; A CONVEYANCE METHOD PREHEATING A MASK BEFORE EXPOSING; AND A DEVICE MANUFACTURING SYSTEM AND METHOD MANUFACTURING A DEVICE ACCORDING TO THE EXPOSURE APPARATUS AND METHOD

This application is a Continuation of application Ser. No. 08/995,809, filed Dec. 22, 1997, now which was a Continuation-In-Part of application Ser. No. 08/815,273 filed Mar. 10, 1997 now abandoned.

BACKGROUND OF THE INVENTION

This application is a continuation-in-part application of U.S. patent application, Ser. No. 08/815,273, filed Mar. 10, 1997. The present invention relates to an exposure apparatus and method, and more specifically, to a lithography process and apparatus used for the fabrication of items such as ICs, liquid crystal substrates, thin-film magnetic heads, etc.

Prior exposure systems for the fabrication of ICs and liquid crystal substrates employed various mechanisms to correct changes in the image-forming condition (e.g., magnification or focal position) due to factors such as changes in atmospheric pressure or absorption of exposure light by a projecting optical system. Methods proposed for these correction mechanisms in the past include, for example, shifting individual lens elements forming a projecting optical system along the optical axis, tilting them with respect to planes perpendicular to the optical axis, and adjusting the pressure in the airtight spaces between lens elements (see U.S. Pat. No. 4,666,273).

However, since the exposure light passes through the mask, some of it is absorbed, which heats the mask, causing thermal expansion. This creates problems in that it changes the image-forming condition of the projecting optical system (i.e., the location and magnification of a projected image of the mask pattern). Technology to solve this problem was proposed in Japanese Kokai (Laid-Open Patent Application) No. H4(1992)-192317. This solution involved calculating the amount of thermal deformation of a mask caused by absorption of an irradiated light using a prescribed numerical calculation. After calculating a change in the image-forming properties caused in response to this amount of thermal deformation, the lens elements of the projecting optical system are driven in the optical axis direction or an inclined direction around an axis at right angles to this optical axis, on the basis of the result of this calculation, thereby obtaining a desired image-forming condition.

The thermal expansion of the mask causes a change in distance between the position of the projected image of the mask pattern and the detecting position of a detecting optical system detecting a mark on a wafer serving as the sensitive substrate (baseline). This creates an additional problem in that it degrades the overall accuracy of the overlay alignment when multiple additional mask pattern images are superimposed over mask patterns formed on a wafer. This also could cause alignment error between the mask and the wafer in an operation known as global alignment.

For the problem of change in the baseline, on the other hand, the amount of thermal expansion of the mask in a two-dimensional plane at right angles to the optical axis caused by thermal expansion of the mask is determined by calculation. A positional deviation of the wafer relative to the mask exposure apparatus is avoided by controlling the amount of baseline from time to time on the basis of the result of this calculation when the amount of thermal expansion of the mask increases above a prescribed value (Japanese Unexamined Patent Publication No. 7-74075).

However, while the foregoing technique disclosed in Japanese Unexamined Patent Publication No. 4-192317 permits correction of a change in the image-forming condition caused by thermal expansion of the mask, it is impossible to correct a positional deviation of the mask relative to the exposure apparatus. An image of the pattern region of the mask is formed on a shot region on the wafer serving as the exposed substrate with a positional deviation or a rotational deviation.

In the conventional art of controlling from time to time the baseline (hereinafter appropriately referred to as the "baseline checking") when the calculated amount of thermal expansion of the mask is above a prescribed value, as disclosed in Japanese Unexamined Patent Publication No. 7-74075, it is necessary to frequently perform baseline checking, which takes from several seconds to several minutes as long as the mask continues to thermally expand. This leads to a considerable deterioration of throughput of the exposure apparatus.

The present invention was developed in view of the foregoing problems, and has as an object to provide an exposure apparatus and a method of exposure which do not cause a deterioration of throughput of the exposure apparatus and do not cause a change in baseline or a change in magnification resulting from thermal expansion of the mask.

SUMMARY OF THE INVENTION

Accordingly, it is an object of the present invention to overcome the problems involved with prior art solutions. The present invention was devised with the above problems in mind. Its objective is to provide an exposure method and apparatus through which the detrimental effects of thermal expansion of the reticle can be easily prevented, with no need to perform complex and involved computations.

In order to achieve the above objective, the present invention performs alignment checks and exposure using a mask that has already reached the thermal expansion saturation state, not accounting for mask thermal distortion (thermal expansion distortion, for example) as was necessary in the past. In the following description, thermal expansion is used as an example of mask thermal distortion. Accordingly, since the mask is in a state of thermal expansion saturation, it neither expands nor contracts, holding its shape constant. This method solves the above problems due to mask thermal expansion. The present invention, which is based on this principle as the solution to these problems, is comprised as described below.

A method incorporating the principles of the present invention includes a method for exposing an image of a pattern formed in a mask onto a sensitive substrate. It includes the steps of irradiating the mask with an exposure light and computing data related to the thermal expansion saturation point of the mask due to absorption of the irradiation light. It also includes expanding the mask to the thermal expansion saturation point based on the data computed in the computing step. Finally, the image of the mask pattern is exposed onto the sensitive substrate.

The exposure method incorporating the principles of the present invention can also include an additional step, performed after the mask-expanding step and before the step of exposing the sensitive substrate, of correcting the magnification of the mask pattern.

The method incorporating the principles of the present invention may also comprise a further step, performed after the mask-expanding step and before the step of exposing the sensitive substrate, of aligning the relative positions of the mask and the sensitive substrate such that the center of the mask image is aligned with the center of a shot area of the sensitive substrate.

To achieve the above objective in another mode of the present invention, in an exposure method for exposing an image of a pattern formed in a mask onto a sensitive substrate, the invention comprises the steps of determining the change in the thermal expansion state of the mask due to absorption of exposure light for a predetermined time period, determining the temperature at which thermal expansion saturation of the mask occurs based on the change in the thermal expansion state thereof, and heating the mask to the determined temperature. The final step is exposing the image of a pattern in the mask onto the sensitive substrate.

The method may also include an additional step of controlling the temperature of the mask to hold the temperature of the heated mask at the thermal expansion saturation temperature.

To achieve the above objective, the apparatus according to the principles of the present invention provides an apparatus for exposing an image of a pattern formed in a mask onto a sensitive substrate, and includes an exposure source for irradiating the mask with an irradiation light. It also includes a computation section for computing data related to the thermal expansion saturation point of the mask due to absorption of irradiation light. A memory is provided for storing the data computed by the computation section. Finally, an expansion system is included for expanding the mask based on the data stored in the memory, before starting exposure of the sensitive substrate.

It is desirable for the above expansion system to expand the mask by irradiating it with an exposure light.

It is also desirable for the above expansion system to have a heater for heating the mask.

In addition, the exposure apparatus incorporating the principles of the present invention can also include a control section for controlling the passing and blocking of irradiation. The computation section can compute its data based on the irradiation passing and blocking time periods as controlled by the control section.

In addition, the exposure apparatus incorporating the principles of the present invention can comprise a correction system for correcting the magnification of the mask pattern image. The correction system will change the length of the optical path between the mask and the sensitive substrate in the state wherein the mask has reached the thermal expansion saturation point.

Furthermore, in the computation section of the exposure apparatus incorporating the principles of the present invention, it is desirable for the thermal expansion saturation point of the mask to be computed based on at least one value from among the values determined in accordance with the exposure light, and the values determined in accordance with the characteristics of the mask.

In addition, in the exposure apparatus, it may be desirable for those values determined in accordance with the exposure light to be the luminous energy of the exposure light and the irradiated area on the mask, and for those values determined in accordance with the characteristics of the mask to be the transmissivity of the mask, the reflectivity of the mask, the material of the mask, and the density distribution of the pattern of the mask.

A further preferred embodiment of the present invention includes an exposure apparatus for irradiating an exposure light within a prescribed wavelength range onto a mask to expose a pattern on the mask onto a sensitive substrate. Storage means are included for storing the mask, as well as transfer means for transferring the mask between the storage means and an exposure position. Finally heating means are included for heating the mask in the storage means.

The present invention is also directed to a method of exposure of irradiating an exposure light within a prescribed wavelength range onto a mask, and copying a pattern of the mask onto a substrate. Information of temperature at which thermal expansion of the mask reaches saturation is calculated, and prior to irradiation of the exposure light onto the mask, the substrate is heated on the basis of the information thus calculated.

BRIEF DESCRIPTION OF THE DRAWINGS

The above and other objects, features, and advantages of the present invention will become more apparent from the following detailed description taken with the accompanying drawings, in which:

FIG. 3, including

DETAILED DESCRIPTION OF THE PREFERRED EMBODIMENT

Figure 1:
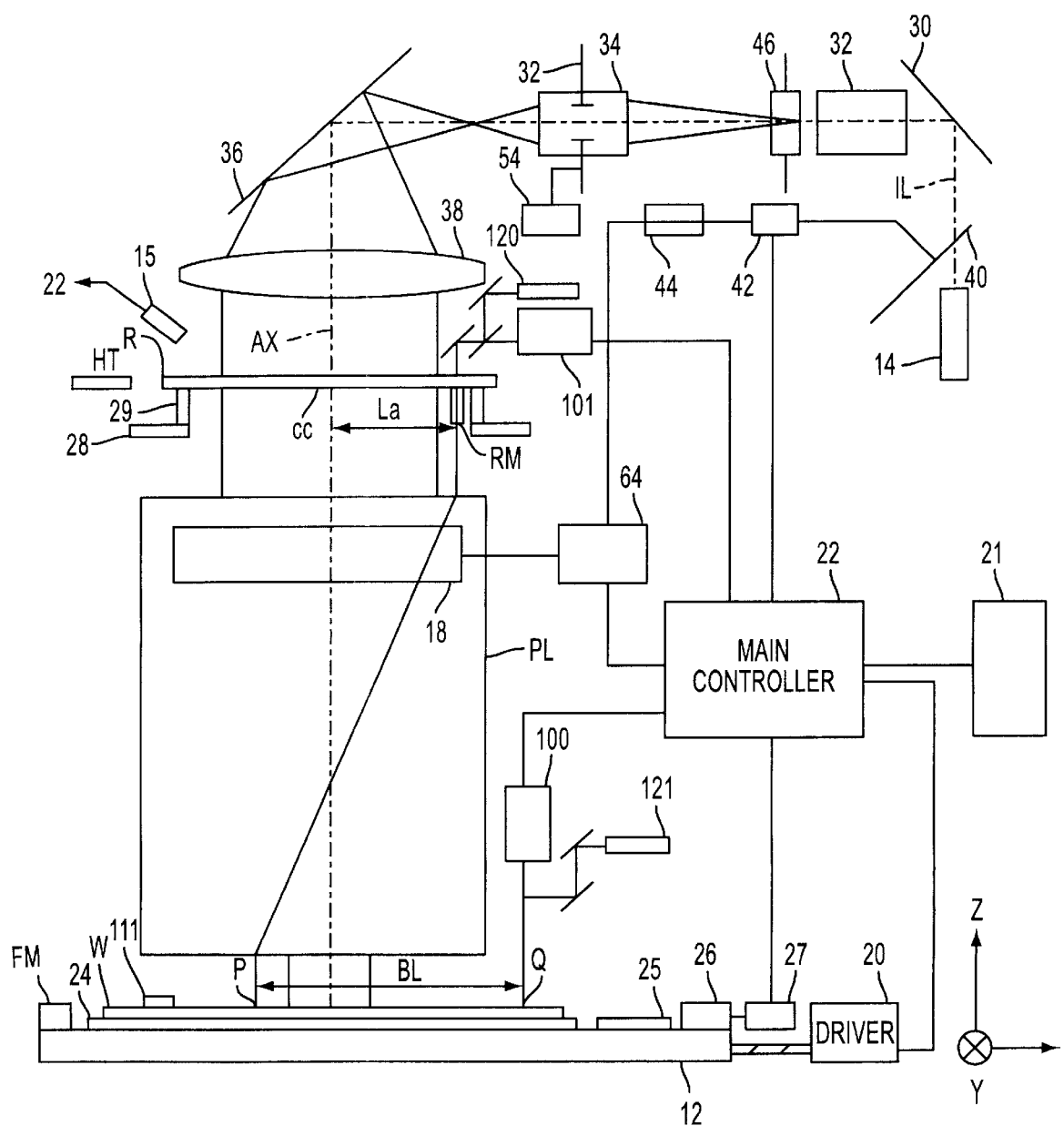
FIG. 1 is a schematic diagram showing the configuration of a first embodiment of the present invention.

Referring to the drawings, FIG. 1 is a simplified schematic diagram showing the exposure apparatus of a first embodiment of the present invention. This apparatus includes the following:

a wafer stage 12, which is capable of two-dimensional travel in a plane perpendicular to the page (XY plane);

a projection lens PL (the projection optical system), which projects the image of the reticle R pattern (the mask) placed above the projection lens PL, onto a wafer W (the sensitive substrate);

an exposure light source 14, which emits irradiation light IL;

an irradiation optical system, which directs the irradiation light IL onto the reticle R;

an image reduction mechanism 18, which adjusts the magnification at which the image of the pattern in the reticle R is projected;

a main controller 22, which controls the above elements;

a wafer alignment system 100, for performing wafer alignment and baseline checks; and a through-the-reticle (TTR) alignment system 101, for performing reticle alignment and baseline checks.

The projection lens PL is positioned with its optical axis AX perpendicular to the plane of motion of the wafer stage 12.

The wafer stage 12 is provided with a stage driver 20, whose components include drive motors (not illustrated). A photointerferometer 27 measures the travel of the wafer stage 12 by measuring the travel of a movement mirror 26. Although not illustrated, there are actually two photointerferometers 27, which measure the travel of the stage in the X and Y axes, respectively. The main controller 22 drives the stage driver 20 based on the output of the photointerferometer 27. This configuration enables the wafer stage 12 to be moved along the X and Y coordinate axes. Provided on the wafer stage 12 is a wafer holder 24, to which a wafer W is held fast by vacuum-induced suction. Also provided on the wafer stage 12 are a dummy exposure area 25 (to be described later) and a fiducial mark FM.

In this embodiment, the projection lens used for the projection lens PL is one that is telecentric from both ends. Although they are not shown in the drawing, this projection lens PL is actually made up of multiple lens elements positioned along its optical axis AX (the Z axis).

The reticle R is supported on a reticle stage 28, which is capable of a slight amount of movement in the X, Y, and θ directions in a plane perpendicular to the optical axis AX of the projection lens PL. The pattern surface in the reticle R is in a conjugate relationship with the surface of the wafer W relative to the projection lens PL.

The light source 14 emits an irradiating light IL of a wavelength to which the photosensitive material coated as resist on the wafer W is photosensitive. This light source could be, for example, a high-intensity mercury lamp, an excimer laser (KrF, ArF, $F_2$), a YAG laser, emitting, respectively, an exposure light such as g-ray or i-ray, excimer light (248 nm wavelength KrF or 193 nm wavelength ArF and 180 nm for $F_2$), or a harmonic wave of YAG laser high-frequency light (wavelengths of 200 nm or less), as irradiation light IL. In this embodiment, the light source 14 is an i-line source.

The illumination optical system that directs irradiation light IL onto the reticle R includes a mirror 30, which reflects the irradiation light IL being emitted from the light source 14 (changing it to the horizontal in the process), and also has the following additional components along the path of the irradiation light IL being reflected by the mirror 30:

fly-eye optics 32, which includes an optical integrator (fly-eye lens), etc.;

relay optics 34;

a dichroic mirror 36, positioned diagonally above the reticle R at approximately a 45-degree angle; and a main condenser lens 38, between the dichroic mirror 36 and the reticle R.

Provided between the light source 14 and the mirror 30 is a control section in the form of a shutter 40, which opens and closes the irradiation light IL light path for selected time periods. The shutter 40 is driven by a shutter driver 42, under the control of a shutter-control circuit 44. An irradiation stop 46 is situated in the exit plane of the fly-eye optical system 32 (the Fourier transform plane 46 for the reticle R). The irradiating surface of the fly-eye lens optical system 32 is placed in a conjugate relationship to the pupil plane of the projection lens PL.

Included in the relay optical system 34 is a blind 52, provided for the purpose of varying the size of the area on the reticle R irradiated by the irradiation light IL. The blind 52, which is placed in a conjugate relationship with the pattern surface of the reticle R, is driven by a blind driver 54, to set the irradiation area on the reticle R.

The purpose of the magnification adjustment mechanism 18 is to correct the image-forming properties of the photographic optical system, including, for example, the magnification of the formed image of the projected reticle R pattern image and the location of the optimum image-forming position (focal position). In the present embodiment, a system for adjusting the pressure in the airtight space between specific lens elements of the projection lens PL is used as the magnification adjustment mechanism 18. There are, however, other ways of performing this magnification adjustment function. For example, some of the lens elements that make up the projection lens PL could be tilted, rotated, or shifted along the optical axis AX, using piezoelectric or magnetostrictive devices as drive elements. The image magnification adjustment mechanism 18 is controlled by the image magnification correction controller 64.

Data required to compute thermal expansion saturation points ("saturation temperature") for the reticle R (which experiences thermal expansion due to the absorption of the irradiation light) are stored in memory 21. This stored data includes, for example, data such as the thermal expansion coefficient of the reticle, the size of the irradiation area on the reticle R, the shutter opened/closed ratio, the transmissivity and reflectivity of the reticle, the reticle material, and the sensitivity of the wafer resist. Formulae for calculating the saturation temperature are also stored in memory.

A main controller 22 controls the above-noted shutter-control circuit 44, the magnification correction controller 64, and the wafer stage 12. Although in this embodiment, the main controller 22 also contains the computation means (CPU, etc.) for computing the reticle R saturation temperature, this function could also be performed by a computation means external to the main controller 22.

A wafer alignment system 100 and a TTR alignment system 101 are used for alignment and baseline checks. In order to conduct a so-called global alignment by the use of the wafer alignment system 100 and the TTR alignment system 101, it is necessary to perform baseline checking. Upon baseline checking, therefore, the TTR system 101 can simultaneously detect the reticle mark RM around the circuit pattern region of the reticle R and the fiducial mark FM provided on the wafer stage 12.

The operation of the present embodiment, as shown in FIG. 1, will be explained using an example in which the TTR-type alignment method is used. The TTR alignment system 101 is a through-the-reticle detection optical system positioned above the reticle R. The wafer alignment system 100 is an off-axis-type detection optical system provided at the periphery of the projection lens PL for sensing the fiducial mark FM and the alignment mark 111 during baseline checks and also during wafer alignment. The wafer alignment system 100 and the TTR alignment system 101, both oriented perpendicular to the page (as seen in FIG. 1) are capable of performing two-dimensional alignments between the reticle R and the wafer W, and baseline checks.

The TTR alignment system 101 uses a luminous flux supplied from a light guide 120 to detect the reticle mark RM and the fiducial mark FM. The light guide 120 directs this irradiation light, which has the same wavelength as the irradiation light L, onto the reticle mark RM and the fiducial mark FM. For example, irradiation light L from the light source 14 irradiates the reticle R and the fiducial mark FM through the light guide 120. Similarly, the wafer alignment system 100 uses luminous flux supplied from a light guide 121 to detect the fiducial mark FM and the alignment mark 111. The light supplied by the light guide 121 need not, however, be of the same wavelength as the irradiation light IL. This irradiation light may therefore be supplied by a light source such as a halogen lamp. It should be noted that the irradiation light is used for exposure of the sensitive surface of the wafer so that it can also be referred to as the "exposure" light.

A tag mark TM is provided on a glass plate inside the wafer alignment sensor 100, which is provided at the periphery of the projection lens PL (outside of its projection field). This tag mark TM, which is placed in an approximately conjugate relationship with respect to the projection image plane (the wafer W surface or the surface of the fiducial mark FM), is used as a reference for the detection of the alignment mark 111 on the wafer W and the fiducial mark FM. At the projection image plane end, the optical axis of the wafer alignment system 100 is parallel to the projection lens PL optical axis AX.

The following paragraphs describe process steps wherein, in an exposure apparatus configured as described above, the thermal expansion saturation point of the reticle R is calculated, and the reticle R is then thermally expanded by applying the amount of thermal energy required to reach this calculated thermal expansion saturation point. Then, after performing a baseline check, alignment, and magnification correction using this thermally expanded reticle R, the exposure of the reticle R pattern onto the wafer W (the "sensitive" substrate) is begun. The temperature at which the thermal expansion of the reticle R saturates is considered to be the temperature at which the above thermal expansion saturation point is reached.

These process steps for exposing the reticle R pattern onto the wafer W call for the thermal expansion saturation point of the reticle R to be calculated prior to carrying out an actual exposure shot on the wafer W. First, the method of performing this calculation will be explained.

An example will be explained in which, in the exposure apparatus of the present embodiment, the wafer stage 12, with a wafer W loaded on it, is moved in two dimensions (in the X and Y directions), in sequence. Repeated exposures are performed, to effect multiple exposures of the reticle R pattern image, in sequence, on one wafer, in the so-called step-and-repeat exposure technique. In this apparatus, the shutter 40 is repeatedly opened to pass irradiation light IL, and closed to block it, in synchronization with the movements of the wafer stage 12.

Figure 2:
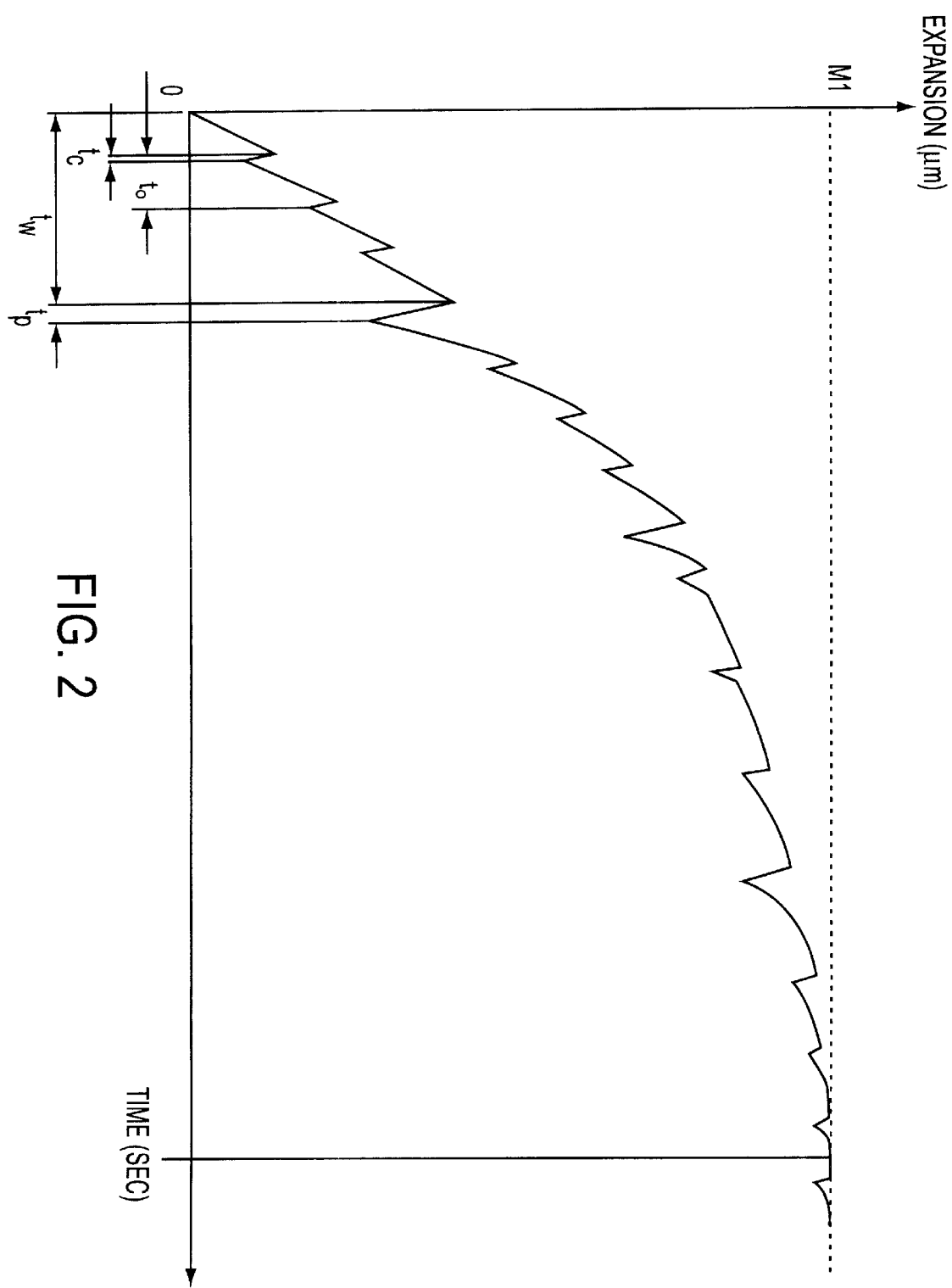
FIG. 2 is a waveform showing the nature of reticle thermal expansion.

FIG. 2 shows the thermal expansion of the reticle as the exposure proceeds. In FIG. 2, $t_o$ represents the "shutter open" time, $t_c$ the "shutter closed" time, $t_w$ the exposure time for one wafer, $t_p$ the wafer change-out time, and t, the time for the reticle to reach the thermal expansion saturation point. The expansion of the reticle R is a function of the irradiation light power P (W/cm$^2$), the size of the area S (cm$^2$) on the reticle R being irradiated, and the thermal expansion coefficient K ($\mu$m/W) of the reticle R. As mentioned earlier, the irradiated area size S is set by the blind 52, which is driven by a blind driver 54. K, the coefficient of thermal expansion of the reticle, is a function of the transmissivity and reflectivity of the reticle, the reticle material, the density distribution of the reticle pattern, and the type of material used for the blind 52. These are constants that are set in advance before performing an exposure. From the foregoing, the thermal expansion saturation point M, can be expressed by the following equation (1):

$$M_1 = K \cdot P \cdot S \cdot t_o / (t + t_c) \quad (1)$$

The thermal expansion saturation point is the expansion change distance, per unit distance, from the normal state to where the thermal expansion has reached the saturated state.

Also, M, the saturation point if the shutter is left open and the reticle continuously flooded with irradiation light IL, is given by the following equation (2):

$$M = K \cdot P \cdot S' \cdot 1(1 - \exp(-(t/T))) \quad (2)$$

where S' (cm$^2$) is the irradiated area, and T (sec) is the reticle thermal expansion time constant. The thermal expansion time constant T is determined in advance, as are parameters such as the reticle coefficient of thermal expansion K.

Next, at time t, the time required for a reticle that has been thermally expanded by holding the shutter open and continuously flooding the reticle with irradiation light IL to reach the thermal expansion point $M_1$ for a reticle R that is thermally expanded by repeatedly opening and closing the shutter, is determined. Since this time t is the time when $M_1$ of equation (1) and M of equation (2) are equal, it can be expressed by the following equation (3):

$$t = T \cdot I_n (1 - S/S' \cdot t_o/(t_{o-tc})) \quad (3)$$

In other words, the amount of thermal energy it will require to expand the reticle R to the thermal expansion saturation point can be determined by flooding the reticle R with irradiation light for a period equal to time t as determined from equation (3).

Thus the reticle R is continuously irradiated with irradiation light IL, up to time t, as described above. This expands the reticle R to the thermal expansion saturation point prior to starting the exposure. During the time it takes the reticle R to reach thermal expansion saturation, the irradiation light IL is directed onto a dummy exposure area 25. The dummy exposure area 25 is placed under the reticle R, but in an area of the wafer stage 12 different from that of the wafer holder 24. This is done to prevent problems with thermal expansion of the wafer holder 24 due to its being irradiated by irradiation light IL during this time.

Another possible method for preventing undesirable effects of thermal expansion of the wafer holder 24 due to irradiation outside of the dummy exposure area 25 is to move the reticle stage 28 (and the reticle R), and then flood the moved reticle R with irradiation light IL, to avoid irradiating the wafer holder 24. In this method, a movable-type mirror (not illustrated) is inserted into the irradiation light IL light path by a given drive system (not illustrated), only while the reticle R is being irradiated for the purpose of expanding it. The purpose of this movable mirror is to reflect irradiation light IL onto the side-tracked reticle stage 28. In still another method, the wafer stage 12, with a wafer holder 24 on it, could be moved away from the spot being flooded with irradiation light IL.

It should be pointed out that although in the present embodiment, the reticle R is expanded by flooding it with irradiation light IL, the invention is not limited to this mode. Other devices such as a heater HT capable of applying enough thermal energy to expand the reticle R to the thermal expansion saturation point may also be used. To do this, the heater HT could be provided to the side of the reticle R, as shown in FIG. 1, for example. Also, it could be inserted between the condenser lens 38 and the reticle R by a drive system (not illustrated) only while the thermal energy is being applied to the reticle R, then retracted from the IL light path after the reticle R has been heated long enough to expand it to the thermal expansion saturation point.

The heater HT may also be mounted on the reticle holder 29. The heat sources that might be used for the heater HT include heat wire or microwave radiation. Because in this method, the wafer holder 24 is not irradiated by irradiation light IL, the above problems associated with thermal expansion of the wafer holder 24 are avoided.

Expanding the reticle R by absorption of the irradiation or exposure light IL, however, causes a change between the magnification before and after expansion. The magnification, therefore, must be corrected by the amount of this change. The method used to perform this magnification correction is explained below.

The CPU in the main controller 22 computes, in advance, and stores in memory 21, the change in the magnification (hereinafter referred to as the "magnification change") between the normal state, in which the reticle R has not yet absorbed heat, and the state after it has reached thermal expansion saturation. This magnification change can be calculated from equation (1).

The main controller 22 reads this magnification change value from memory 21 and controls the magnification adjustment mechanism 18 through the magnification correction controller 64, based on that value. Under the control of the magnification correction controller 64, the magnification adjustment mechanism 18 adjusts the pressure in the airtight space between specific lens elements forming the projection lens PL, to correct the magnification to what it was before the reticle R was expanded.

In this manner, the magnification is corrected by the amount it was changed by the expansion of the reticle R to the thermal expansion saturation point. This effectively eliminates the problem of the magnification change due to thermal expansion of the reticle R, enabling a constant magnification to be maintained throughout the exposure process.

In the present embodiment, adjusting the pressure in the airtight space between the lens elements changes the length of the optical path between the reticle R and the wafer W. The length of this optical path, however, can also be changed by shifting some of the lens elements that make up the projection optical system in a direction parallel to the optical axis. Japanese Kokai H4-192317 has a detailed disclosure of a method for changing the length of the optical path by shifting the lens elements in this manner to correct the magnification.

Once the magnification has been corrected as described above, a baseline check must be performed before starting exposure using the reticle R expanded to the thermal expansion saturation point, as described above. The reticle R is held by the reticle stage 28, and the reticle stage 28 is moved so as to align the center (CC) of the reticle R with the optical axis AX of the projection lens PL. As mentioned earlier, a fiducial mark FM is provided on the wafer stage 12. The wafer stage 12 is now positioned so as to place this fiducial mark FM in a prescribed location within the projection field of the projection lens PL. During alignment, the TTR alignment system 101, above the reticle R, simultaneously detects the positions of the reticle mark RM on the reticle R and the fiducial mark FM on the wafer W and performs alignment. At this time, the main controller 22 measures the position of the wafer stage 12 with a photointerferometer 27.

Next, the wafer stage 12 is moved to a location in which the fiducial mark FM can be detected by the wafer alignment system 100. Then, when the fiducial mark FM is aligned with the tag mark TM within the system 100 (i.e., when the fiducial mark FM is aligned with the detected center of the wafer alignment system 100), the main controller 22 again measures the position of the wafer stage 12 with the photointerferometer 27.

The amount of baseline BL, however, is determined by the main controller 22, by calculating the difference (P–Q) shown in FIG. 1. This is the difference between the position of the wafer stage 12 when the reticle mark RM is aligned with the fiducial mark FM (position P), and the position of the wafer stage 12 when the tag mark TM is aligned with the fiducial mark FM (position Q). (The positions are measured by photointerferometer 27, etc.).

This amount of baseline BL will later be used as the standard amount when aligning the mark on the wafer by means of the wafer alignment system 100 and feeding the same directly under the projection lens PL during alignment. That is, the baseline amount is the standard amount used to position the center of the projected reticle image in the center of a shot. Thus if X3 is the position of the wafer stage 12 when the alignment mark 111 is aligned with the tag mark TM the wafer stage 12 can be positioned to align the center of the shot with the center CC of the reticle R by moving it to the coordinates obtained by correcting the coordinates of the position X3 by an amount equal to the baseline amount BL.

Although alignment using the baseline was explained here in terms of one dimension (direction) only, in reality, two dimensions must be utilized. Thus once the position of the mark on the wafer W has been measured using the wafer alignment system 100, it is possible to immediately put the reticle R pattern accurately over the shot region on the wafer W for exposure by simply feeding the wafer stage 12 by a certain amount.

Thus a baseline c heck is performed as described above before starting an exposure using a reticle R pre-expanded to the thermal expansion saturation point. This enables precise exposures to be performed without having the baseline check thrown off by expansion of the reticle R due to absorption of irradiation light IL.

Once the baseline check is completed, the wafer alignment can be performed. In this embodiment, several (5 to 10) of the shot areas on the wafer W are selected as samples, and the positions of the alignment marks formed at the perimeters of these sample shot areas are measured. Alignment is then performed by positioning the wafer stage 12 under the projection lens using the mark position measurement data and the mark design values based on the shot arrangement coordinates calculated by the statistical calculation technique.

Figure 3A:
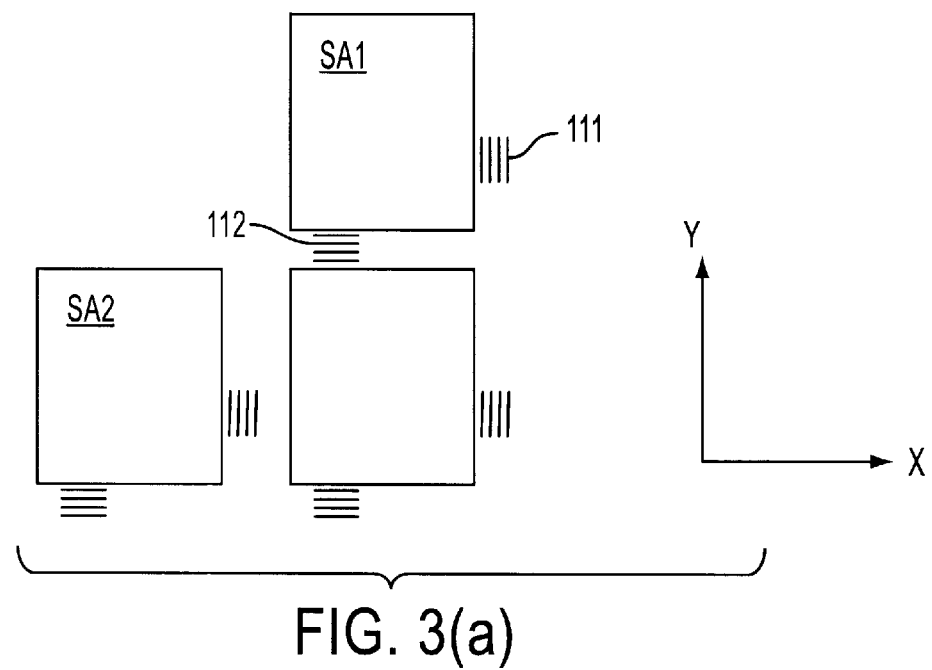
FIGS. 3(a) and 3(b), are schematic diagrams showing alignment marks and tag marks.

This alignment method, referred to hereinafter as EGA (enhanced global alignment), is disclosed in detail, for example, in U.S. Pat. No. 4,780,617. In the present embodiment, the measurement of the wafer mark positions is performed using the wafer alignment system 100 provided at the periphery of the projection lens PL. This wafer alignment system 100 has tag marks TM formed in multi-line patterns (shown in FIG. 3(b) as $TMX_1$, $TMX_2$, $TMY_1$, and $TMY_2$). Shown in FIG. 3(a) are sample shots (sample areas) SA, for example, alignment marks 111 and 112 of the multi-line pattern are formed around the sample shot SA1.

Figure 3B:
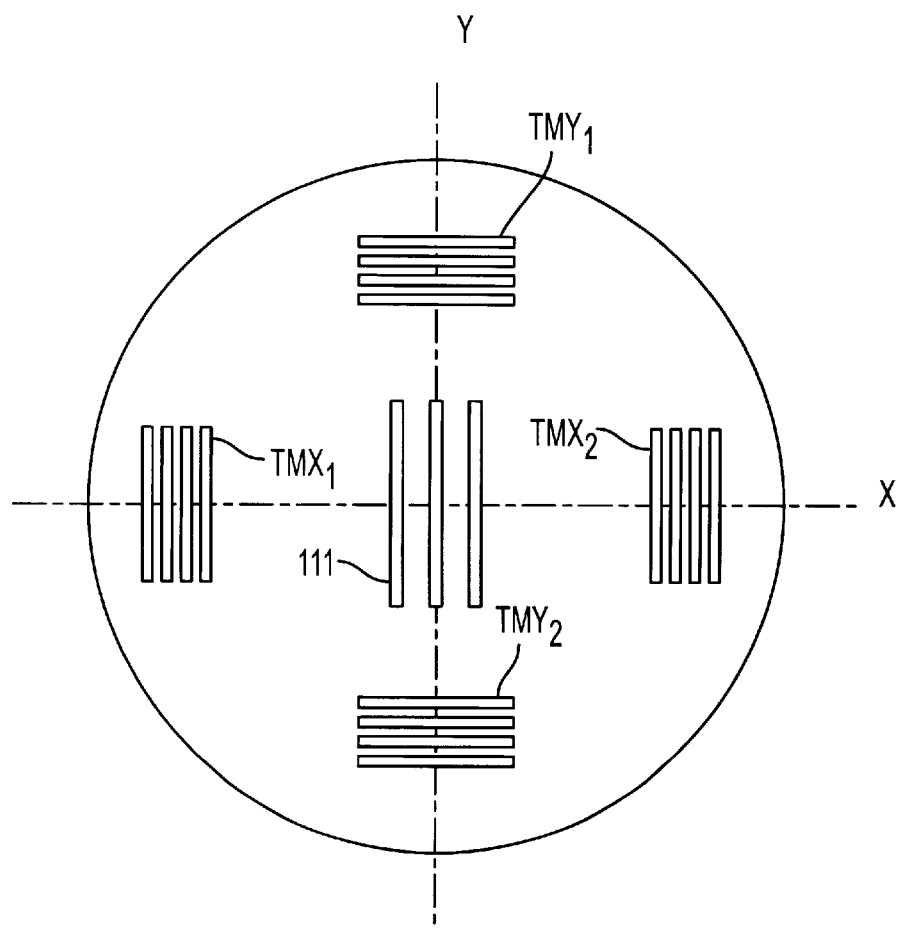

More specifically, the wafer stage 12 is first positioned so that the alignment marks 111, formed around the sample shot SA1 on the wafer W, are between the tag marks $TMX_1$ and $TMX_2$, within the detection region of the wafer alignment system 100, as shown in FIG. 3(b).

Then, the main controller 22 reads the position coordinates of the positioned wafer stage 12 from the photointerferometer 27. The wafer alignment system 100 contains a CCD camera, which simultaneously takes pictures of the images of the alignment mark 111 and the tag marks $TMX_1$ and $TMX_2$, and outputs image signals corresponding to the alignment mark 111 and the tag marks TM for processing by the main controller 22. This processing consists of determining the amount of displacement between the center of the tag plate and that of the alignment mark 111, and calculating the X-coordinate of the alignment mark 111 based on this displacement and the position coordinates of the wafer stage 12 at this point. Similarly, the Y-coordinate of the alignment mark 112 is found using the tag marks $TMY_1$ and $TMY_2$. The alignment mark position coordinates of each remaining sample shot is measured the same way. Based on these measurements, the main controller 22 determines the shot array coordinates on the wafer W, as determined by the EGA method, and moves the wafer stage 12 based on these array coordinates and the amount of baseline BL, to execute the alignment.

After a given time, however, the reticle R, which had been expanded to the thermal expansion saturation point, will begin to shrink. A temperature sensor 15 constantly monitors the temperature of the reticle R to prevent shrinkage. An infrared sensor, for instance, might be used for the sensor 15. For convenience in drafting FIG. 1, only one temperature sensor 15 is shown, but a number of sensors could be provided around the reticle R. The main controller 22 monitors the output of the temperature sensor 15, and when this output indicates that the temperature of the reticle R has dropped below the thermal expansion saturation point, the main controller 22 heats it up again by flooding it with irradiation light during nonexposure periods.

If the reticle R is being expanded by a heater HT installed on the reticle holder 29, the main controller 22 can constantly monitor the output of the temperature sensor 15 and control the heater to keep the reticle R temperature constant.

The operation of a second and third embodiment will now be described.

Figure 4:
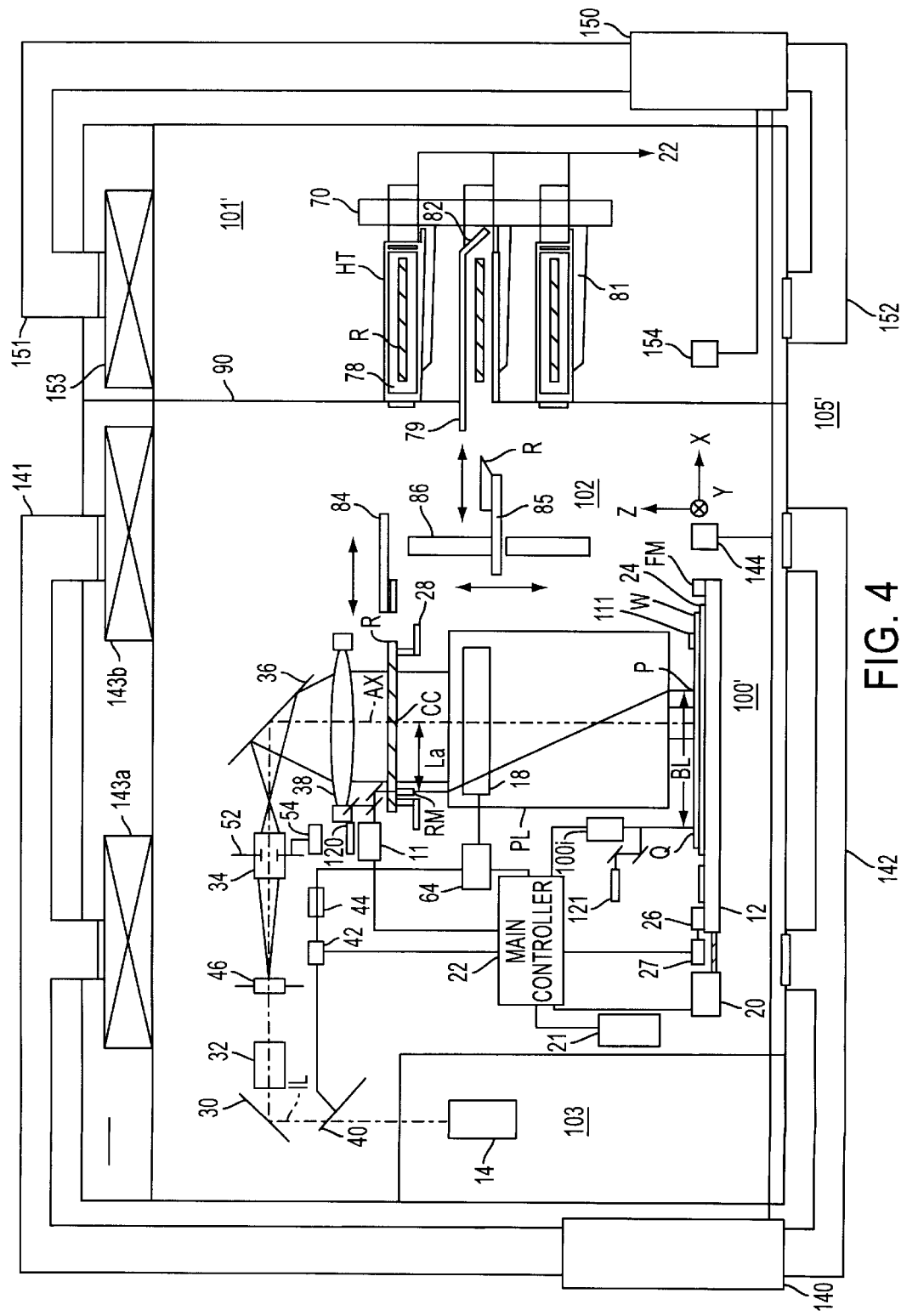
FIG. 4 is a schematic diagram showing the configuration of a second embodiment of the present invention.

FIG. 4 is a schematic configuration diagram illustrating an exposure apparatus of a second embodiment of the invention. The elements that perform the same function as the elements of FIG. 1 are identified by the same numerals.

This exposure apparatus is provided with a main body 100' and an auto-reticle loader 101' in a chamber 105'. The details of configuration of this exposure apparatus will now be described below for each of the main body 100'and the auto-reticle loader 101'.

The main body 100' of FIG. 4 is the same as that shown in the first embodiment of FIG. 1 with some exceptions, as noted below. A light source 14 is provided in a lamp house 103 so as to prevent the heat produced by the emission from the light source 14 from flowing out into the main body 100 of the exposure apparatus. The interior of the lamp house 103 is air-cooled by a fan or the like (not shown) to prevent breakage caused by self-heat generation of the light source 14.

Now, the configuration of the auto-reticle loader 101' will be described below. The auto-reticle loader 101' comprises a reticle library 70 capable of storing a plurality of reticles, and a reticle transfer system 102 which transfers the reticle from the reticle library 70 to the main body 100'.

Figure 5:
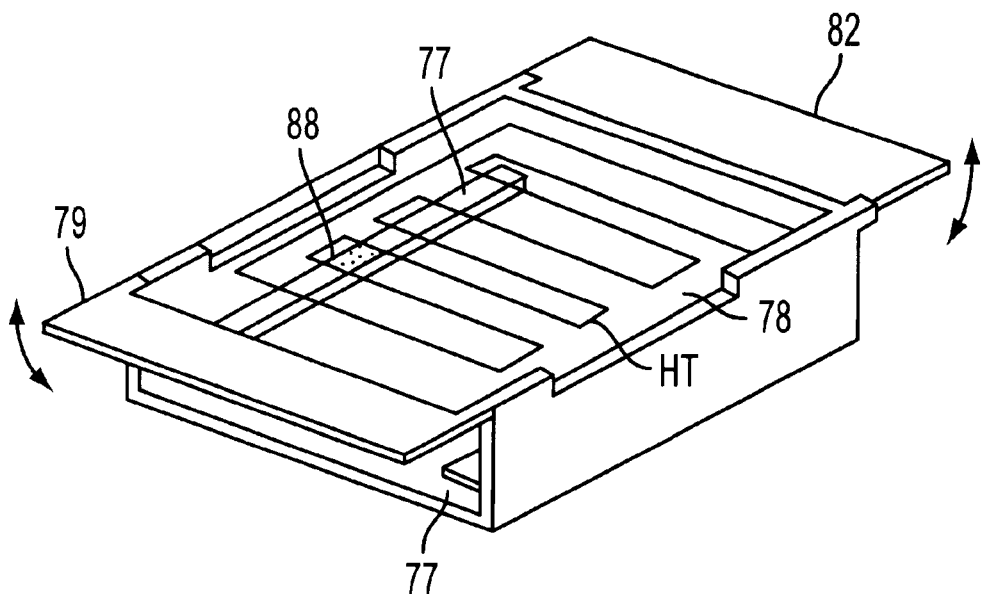
FIG. 5 is a perspective view illustrating a reticle case.
Figure 6:
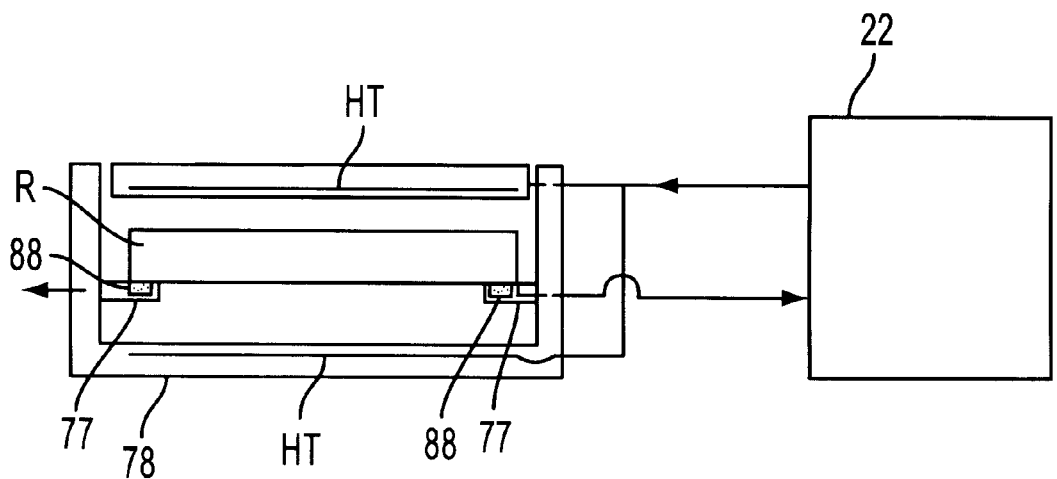
FIG. 6 is a front view, partially broken away, of the reticle case of FIG. 5.

The individual reticles stored in the reticle library 70 are housed in reticle cases 78 as shown in FIGS. 5 and 6. As a result, it is not necessary to directly touch the reticle, thus making it possible to handle reticles in units of case. It is thus possible to prevent adherence of dust or breakage before storing the reticle into the reticle library 70. A plurality of reticle cases 78 are attached to the reticle library 70. This attachment is by way of holding reticle cases 78 with reticle holding members 81 provided in the reticle library 70.

The reticle case 78 shown in FIGS. 5 and 6 has reticle heaters HT on the upper and lower surface thereof to heat the reticle R arranged between these reticle heaters HT. The reticle R is not shown in FIG. 5 to avoid unnecessarily complicating the drawing. The reticle heater HT heats the reticle until a saturation temperature is reached under control of the main controller 22. The upper surface and the lower surface of the reticle heater HT are separately available under the control of the main controller 22. For a certain amount of heating, furthermore, the reticle heater may be arranged on only one of the upper and lower surfaces. It is therefore possible to heat the reticle with the necessary and minimum amount of heat.

A heating wire type heater having stretched wires or a Pertier element is used as the reticle heater HT. Although there is a temperature increase of the space surrounding the heater, the heating wire type heater provides advantages of easy configuration and low cost. The Pertier element gives a higher performance than other types of heaters, although it requires a larger power consumption. In this embodiment, a typical heating wire type heater will be described (FIG. 5). In a reticle heater HT using a heating wire type heater of a Pertier element, it is desirable to arrange the heater so as to achieve isotropic expansion of the reticle.

The reticle case 78 includes a reticle stand 77 for placing reticles (R) on the side thereof, and an opening/closing port 79 for transferring the reticle R from the case 78 by means of a reticle transfer system 102, described later, on the side thereof facing the main body 100'. The reticle case 78 further has an opening/closing port 82 on a side opposite to the opening/closing port 79.

A temperature sensor 88 is placed on, or built in, the reticle stand 77 projecting inwardly from the right and left sides of the reticle case 78, and measures temperature of the reticle R. The main controller 22 controls the reticle heater HT on the basis of the measured value of the temperature sensor 88, and maintains the reticle R at a desired temperature. The temperature sensor 88 should, for example, preferably be one which converts temperature into an electric signal, such as a current, voltage, or resistance value, for the convenience of feeding back the result to the heater HT through the main controller 22. A thermistor or a platinum-rhodium resistor may be used for this purpose.

As shown in FIG. 4, the reticle transfer system 102 comprises a reticle transfer arm 83 which transfers out the reticle (R) from the reticle case 78, a loading arm 84 which mounts the reticle onto a reticle stage 28, and a lateral slider 85 and a longitudinal slider 86 capable of being driven for sliding.

The processing steps for the first embodiment have been described above. The processing steps of the exposure apparatus having the configuration of the second embodiment (FIG. 4) include calculating the saturation temperature of the reticle R, heating the reticle R in the reticle case 78 until the thus calculated saturation temperature is reached, carrying out baseline checking and magnification correction by the use of the heated reticle R, and the exposure of the pattern of the reticle R onto the wafer W.

In the foregoing processing steps of exposing the pattern of the reticle R onto the wafer W, the saturation temperature of the reticle R is calculated by the main controller 22 prior to actual exposure shooting of the wafer W. The calculation thereof is substantially the same as that described for the first embodiment.

That is, the saturation temperature T, defined as a temperature upon saturation of thermal expansion of the reticle R, can be calculated by the following equation (4) on the assumption of a density ρ of the effective shielding pattern on the reticle, an exposing power P irradiated onto the reticle per unit time, and a proportional coefficient α:

$$T = \alpha \cdot \rho \cdot P \tag{4}$$

where, the proportional coefficient α depends upon the size, material, transmissivity or reflectivity of the reticle, or an alignment time or a reticle transfer time not directly contributing to the exposure itself The main controller 22 controls the reticle heater HT provided in the reticle case 78 on the basis of the thus calculated saturation temperature.

The reticle heater HT heats the housed reticle R under the control of the main controller 22. The sensor 88 provided in the reticle stand 77 in each reticle case 78 measures temperature of the reticle and feeds back the result of measurement to the main controller 22 (FIG. 3). When temperature of the reticle R as measured by the sensor 88 reaches a previously calculated saturation temperature, the main controller 22 issues an instruction to discontinue heating of the reticle heater HT. When the temperature measured by the temperature sensor 88 drops to below the saturation temperature after discontinuing heating, the main controller 22 again issues an instruction to start heating to the reticle heater HT.

The reticle R having reached the saturation temperature is transferred out by the reticle transfer arm 85. At this point, the opening/closing port 79 provided on the reticle case 78 opens upward. The opening/closing port 79 is closed immediately upon transfer of the reticle R. Opening and closing operations of the opening/closing port 79 are performed only upon transfer of the reticle R. As a result, heat within the reticle case 78 diffuses onto the main body 100' side through the partition 90 to prevent as much as possible any trouble in airconditioning of the main body 100'.

The space within the chamber 105' is divided by the partition 90 into a main chamber and a subchamber. The main chamber is a space containing the main body 100' and the reticle transfer system 102, and the subchamber 101' is a space containing the reticle library 70. The main chamber and the subchamber are separately air-conditioned: the subchamber 101' is controlled so as to have an air pressure lower than in the main chamber 100'. This is to avoid simultaneous airconditioning of the main chamber airconditioned at a high accuracy to prevent a measuring error of the photointerferometer 27 or a change in the imageforming property of the projecting optical system PL, on the one hand, and the subchamber 101' having a high temperature because of the presence of the reticle heater HT, on the other hand. Air-conditioning of the main chamber and the subchamber will now be described below with reference to FIG. 4.

A main chamber air conditioner 140 comprises a cooler, a reheater, and a blower, and controls air-conditioning within the main chamber 100' to a set temperature. The main chamber air conditioner 140 controls the quantity of air blown to the blowing duct 141 on the basis of an output value from the main chamber air pressure sensor 144. Air controlled for temperature and flow rate by the main chamber air conditioner 140 is sent to air purifying filters 143a and 143b provided on the ceiling of the main chamber 100', and after purification, blown into the main chamber.

In this embodiment, the foregoing description has covered a type of air-conditioning known as the downflow type in which air blown into the main chamber flows downward. The present invention is applicable also to air-conditioning of blowing air purified from the sides of the chamber. The downflow type air-conditioning moves dust remaining in the main chamber in the floor direction of the chamber 100', thus preventing splashing of dust in the main chamber. A return duct 142 is provided on the bottom surface of the chamber 100' so that air in the main chamber is sent again to the main chamber air conditioner 140.

Similarly on the subchamber 101' side, on the other hand, there are provided a subchamber air conditioner 150, a subchamber air pressure sensor 154, a subchamber blowing duct 15 1, an air purifying filter 153, and a return duct 152. The downflow type air-conditioning is also applied. The subchamber air conditioner 150 uses as reference not only an output value of the subchamber air pressure sensor 154 but also an output value of the main chamber air pressure sensor 144. The subchamber air pressure sensor 150 controls the quantity of blown air so that the output value of the subchamber air pressure sensor 154 is always lower by zero point several hPa to several hPa than the output of the main chamber air pressure sensor 144.

An opening/closing port 82 provided opposite to the opening/closing port 79 in the reticle case 78 conducts an opening or closing operation in synchronization with an opening or closing operation of the opening/closing port 79. As a result, the opening/closing port 82 plays the role of a ventilation port. Heat within the reticle case 78 does not flow out or diffuse in the main chamber having a higher air pressure. Otherwise the heat can flow out or diffuse through the opening/closing port 79 into the subchamber. Thus deterioration of the airconditioning accuracy of the main chamber is prevented.

When the reticle R is transferred out from the reticle case 78 upon opening the opening/closing port 79, the reticle transfer arm 85 passes the reticle to the loading arm 84 via the lateral slider 85 and the longitudinal slider 86. The loading arm 84 places the reticle R passed from the reticle transfer arm 85 onto the reticle stage 28.

Now, the reticle R placed on the reticle stage 28 is positioned on the reticle stage 28 for baseline checking.

As noted above with respect to FIG. 1, because the reticle R expands by the absorption of heat of the irradiation light IL, magnification varies between before and after expansion. It is therefore necessary to correct the amount of change in magnification. The method of correcting the magnification for this second embodiment is the same as that described with respect to the first embodiment of FIG. 1.

Prior to exposure, baseline checking is performed by the use of the reticle heated in the reticle case 78 and in saturation of thermal expansion. As a result, the reticle R expands under the effect of absorption of the exposure light, and a highly accurate exposure can be accomplished without occurrence of a change in the amount of baseline.

According to this second embodiment as described above, the reticle R is heated to the saturation temperature in the reticle case 78 in which the reticle is mounted in the reticle library 70, and magnification correction and baseline checking are carried out with the use of the reticle having reached the saturation point. It is therefore possible to exclude an adverse effect of an error of baseline checking caused by thermal expansion of the reticle.

While the reticle is heated in the reticle case in this second embodiment, the apparatus incorporating the principles of the present invention is not limited to this. For example, the reticle may be previously heated outside the reticle case to the thermal expansion saturation point. An embodiment in which the reticle is heated outside the reticle case will now be described below. The reticle R is previously heated to the thermal expansion saturation point in a heating chamber (not shown) provided outside a chamber 105. The heating chamber can house a plurality of reticles, and heat a plurality of reticles together or individually. Temperature sensors for measuring temperature of the individual reticles housed in the heating chamber are arranged near the individual reticles. The operator or the controller 22 on the exposure apparatus side determines whether or not the thermal expansion saturation point has been reached for a particular reticle in response to an output of this temperature sensor.

The operator or the main controller 22 takes out a reticle for which the thermal expansion saturation point has been reached from the heating chamber to house it in the reticle case, and houses it in a reticle library within the chamber. This permits reduction of the cost by eliminating a heater in the reticle library. The reticle heated in the heating chamber and housed in the reticle case can be taken out onto the reticle stage 28 as it is.

When a temperature sensor 88 is provided in the reticle case, it is possible to again detect whether or not the reticle, heated in the heating chamber, is still being kept at the thermal expansion saturation point in the reticle library 70. After confirming again from the temperature detected by this temperature sensor 88 that the thermal expansion saturation point has been reached, the main controller 22 places only reticles for which the thermal expansion saturation point is reached onto the reticle stage 28. It is therefore possible to place only reticles for which the thermal expansion saturation point has been reached onto the reticle stage 28. In this embodiment, the reticle transferred into the reticle library 70 has already been heated. It is not therefore necessary to wait for the thermal expansion saturation point to be reached for a reticle in the reticle library 70, this leading to an improved throughput.

When using a heating chamber provided outside the reticle case, it is not always necessary to provide a temperature sensor in the reticle case. That is, it suffices to heat the reticle in the heating chamber outside the reticle case for a period of time sufficient to reach the thermal expansion saturation point, and take out the reticle from the heating chamber after a period of time. The heating time in the heating chamber should preferably be such that the reticle has a temperature higher than the thermal expansion saturation point, taking into account a decrease in the reticle temperature during the time of leaving the heating chamber to placing it onto the reticle stage 28. As a result, it is possible to prevent the reticle temperature from decreasing to below the thermal expansion saturation point and shrinking during the time from leaving the heating chamber to placing onto the reticle stage 28. Even when the reticle is not heated to a temperature higher than the thermal expansion saturation point, a substantial shrinkage of the reticle caused by a decrease in the reticle temperature can be avoided by quickly transferring only reticles within a prescribed time period time after heating in the heating chamber.

In this embodiment, as described above, control is also possible by monitoring the heating chamber temperature and the heating time of the individual reticles, not individually detecting temperature of the heated reticle.

The heating chamber provided outside the chamber 105 may serve also as a reticle library 70. In this case as well, it is not necessary to provide a heater in the reticle case.

An exposure apparatus of a third embodiment of the invention will now be described with reference to FIG. 7. Detailed description of the same portions as those in the first and second embodiments is omitted here.

In the third embodiment, unlike the second embodiment in which the reticle is heated to the saturation temperature in the reticle case, a reticle heater HT2 is provided in the reticle transfer system 102. This reticle heater HT2 heats the reticle R transferred out by the reticle transfer arm 83 during transfer thereof to the reticle stage 28 (the reticle transfer system 102).

Figure 7:
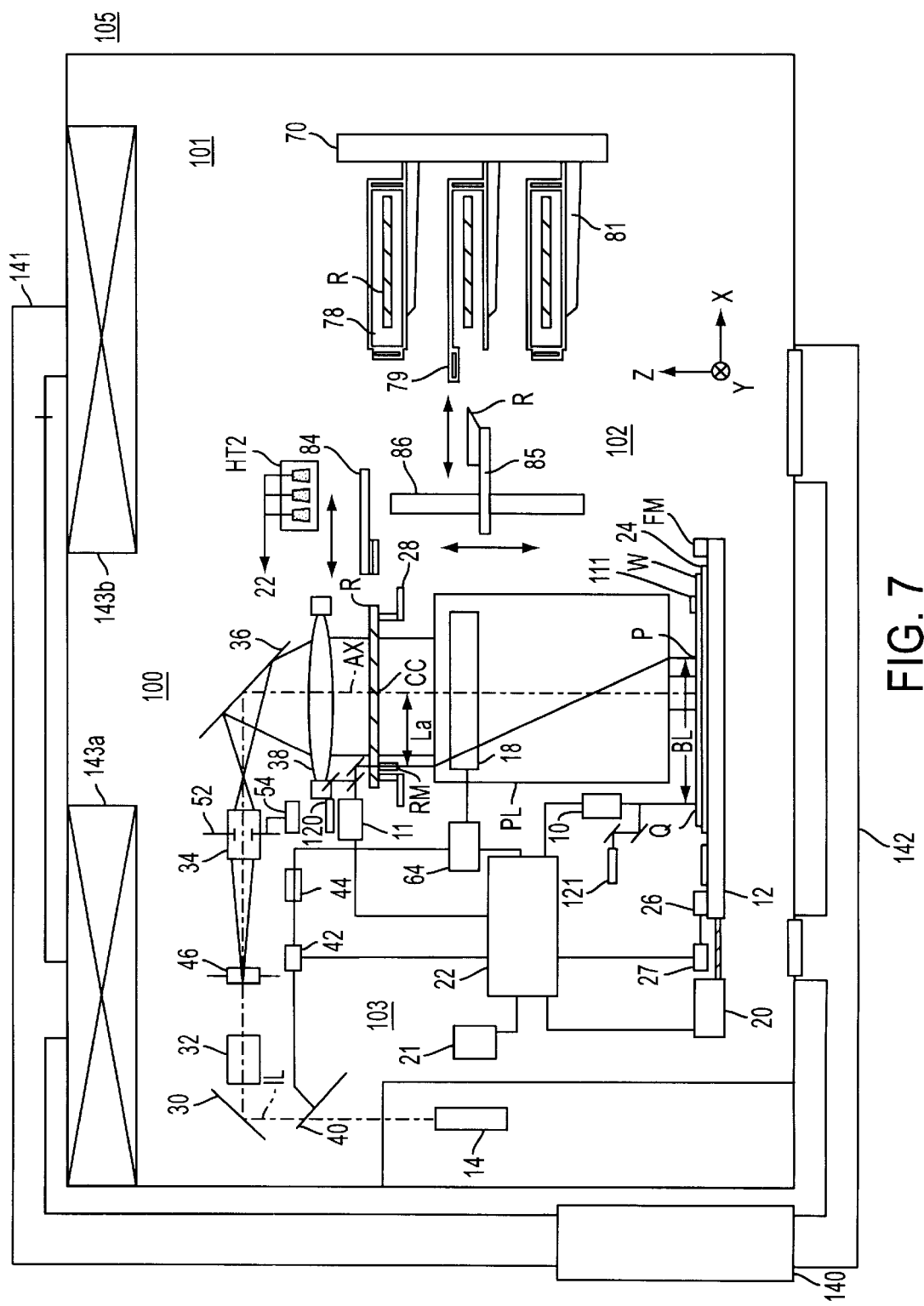
FIG. 7 is a schematic diagram showing the configuration of a third embodiment of the present invention.
Figure 8:
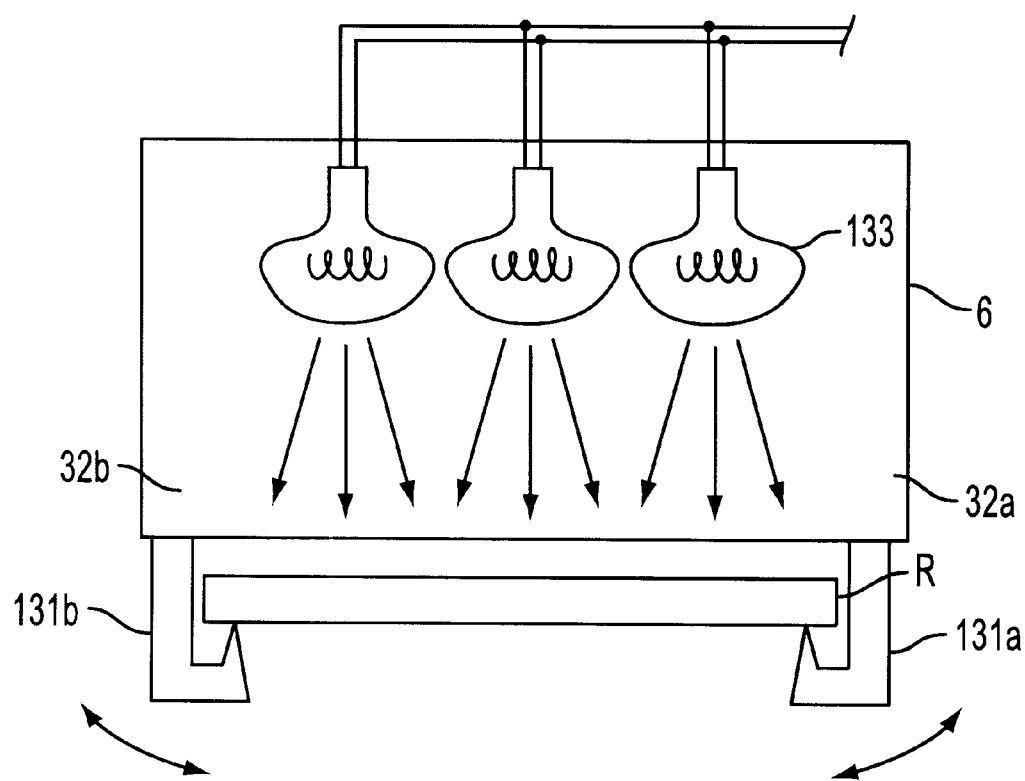
FIG. 8 is a diagram illustrating a reticle heater of the third embodiment of the present invention.

As shown in FIGS. 7 and 8, the reticle heater HT2 has at least one lamp 133 serving as the heat source for heating in a box-shaped interior, and irradiates the light of the lamp 133 through an opening provided in the bottom onto the reticle R. Reticle holders 131a and 131b for holding the reticle R are provided at the bottom of the reticle heater HT2. The reticle holders 131a and 131b are rotatable (opened/closed) around fulcra 31a and 31b, respectively (in the arrow direction in FIG. 8). Now, operation of the reticle heater HT2 of heating the reticle R will be described below.

The reticle R is transferred out from the reticle case 78 by the reticle transfer arm 85, and placed on the reticle loading arm 84 via a longitudinal slider 86. A lateral slider causes the reticle R to slide toward the reticle stage 28.

When the reticle R sliding under the action of the lateral slider 85 reaches the position below the reticle heater HT2, the main controller 22 rotates the reticle holders 131a and 131b, and holds the reticle R as shown in FIG. 8.

After confirmation that the reticle heater HT2 holds the reticle R, the light of the lamp 133 is irradiated onto the reticle R for heating to the saturation temperature previously calculated by the main controller 22. When the reticle R is irradiated by the lamp 133, the reticle holders 131a and 131b remain in the closed state.

When a sensor 134 provided in the reticle heater HT2 detects that the reticle has reached the saturation temperature, the main controller 22 again rotates reticle holders 131a and 131b and places the reticle R on the lateral slider 85.

The reticle heater HT2 may have a prealignment mechanism capable of adjusting the position of the reticle R when the reticle holders 131a and 131b hold the reticle R.

According to this third embodiment, as described above, it is possible to prevent any adverse effect caused by thermal expansion of the reticle, and through simultaneous installation of a prealignment mechanism or the like in the reticle transfer system, space saving of the apparatus can be achieved.

In this embodiment, the reticle heater HT2 has been described as heating the reticle R by using a lamp. The present invention is not however limited to this, but a heater using a Pertier element or a microwave is also applicable.

In the present invention, as described above, thermal expansion is previously caused isotropically before exposure, and a mask in a state with saturated thermal expansion is employed. Therefore, application to the following exposure apparatuses is particularly effective.

That is, an exposure apparatus using a shielding plate having an arcuate opening when irradiating an exposure light from a light source onto a reticle, as is disclosed, for example, in Japanese Unexamined Patent Publication No. 6-97047. In such an exposure apparatus, the exposure light having passed through the arcuate opening is irradiated onto an arcuate irradiation region formed on the reticle. The reticle does not therefore expand isotropically, resulting in an adverse effect such as deterioration of the overall superposing accuracy.

When the exposure wavelength of the exposure light IL emitted from the light source 14 becomes under about 180 nm, the material for the reticle (mask) for transmission of the light of this wavelength is limited to fluorite. However, fluorite has a thermal expansion coefficient larger by a digit (about 20 ppm/° C.) as compared with that of quartz glass conventionally used as a mask material. This means that fluorite leads to a thermal expansion under irradiation of the exposure light that is far larger than that of quartz glass.

The present invention is therefore particularly suitable for an exposure apparatus and a method of exposure using an $F_2$ laser as the light source, which leads to an exposure wavelength of under 180 nm.

In the foregoing embodiments, the reticle has been described as being heated to the thermal expansion saturation point. However, the invention is not limited to this, but it is applicable also to a wafer serving as a substrate or a glass substrate. Thermal expansion is caused by irradiation of the exposure light also in a wafer or a glass substrate as in the reticle, and this may produce various adverse effects. It is desirable in this case to heat the wafer or the glass substrate during the transfer process from the wafer library housing at least one wafer onto the wafer stage 12.

According to the present invention, it is possible to prevent deterioration of the overall superposing accuracy when superimposing a plurality of images of another reticle pattern over a reticle pattern formed on a wafer, under the effect of reticle thermal expansion, and also to prevent the decrease in throughput.

Also, in the above explanation, it was assumed that the expansion of the reticle R was uniform in all directions from the center. If this is not the case, however, regulation standard measurement instruments can be used to detect the center of the reticle R in the thermal expansion saturation state by actual measurement, or the reticle center can be detected using image processing once the video signal of the image has been acquired. A value equal to the displacement from the measured reticle center reference value (the distance between the reticle mark RM and the reticle center, determined in advance), multiplied by the image magnification, can then be added to the baseline magnitude BL as an offset during alignment. This will prevent the total overlay alignment accuracy from being degraded to less than that possible if the thermal expansion of the reticle R had been uniformly omnidirectional.

Moreover, although an exposure apparatus using the step-and-repeat exposure technique was described as one mode of the present invention, the invention is not, in fact, limited to this mode: It can be applied in any system that uses lot exposure techniques. This is true because it focuses on the fact that thermal expansion of the reticle occurs due to its absorption of irradiation light over time during exposure of multiple wafers in one or multiple lots using the same reticle, and has as its objective the prevention of the above-described detrimental effects of thermal expansion of the reticle.

According to the present invention as described above, baseline checks and magnification corrections are performed using a reticle that has been expanded to the thermal expansion saturation point. This prevents loss of precision due to thermal expansion of the reticle, and eliminates past problems with loss of precision due to prediction errors, and the necessity for complex and involved computations.

Various modifications will become possible for those skilled in the art after receiving the teachings of the present disclosure without departing from the scope thereof.

What is claimed is:

1. An exposure method for exposing a sensitive substrate, including transferring a mask's mask pattern onto the sensitive substrate by illuminating the mask with an exposure beam, comprising:
preheating the mask to a specific temperature to deform the mask before the illuminating of the mask and to suppress deformation of the mask during the illuminating of the mask; and
transferring the mask pattern of the preheated mask to the sensitive substrate by illuminating the preheated mask with the exposure beam,
wherein the specific temperature is a temperature that is dependent on a saturation point of the mask where the thermal deformation of the mask is saturated.

2. The exposure method of claim 1, further comprising obtaining information pertaining to the saturation point based on an amount of energy that is applied to the mask by the illuminating of the mask with the exposure beam.

3. The exposure method of claim 1, further comprising obtaining information pertaining to the saturation point based on at least one of the mask pattern that is formed on the mask, an illumination area of the exposure beam on the mask, an exposure time with which the mask is exposed to the exposure beam, a reflectance of the mask, a transmittance of the mask, and a sensitivity of the sensitive substrate.

4. The exposure method of claim 1, further comprising obtaining information pertaining to the saturation point through calculations based on a specific calculation formula.

5. The exposure method of claim 4, further comprising storing into memory the specific calculation formula before obtaining the information pertaining to the saturation point.

6. The exposure method the claim 1, further comprising obtaining information pertaining to the saturation point based on measurement data of the saturation point from measurements performed on the mask.

7. The exposure method of claim 6, further comprising storing into a memory the measurement data before preheating the mask.

8. The exposure method of claim 3, wherein the mask is preheated by the exposure beam.

9. The exposure method of claim 3, wherein the mask is preheated by a heater.

10. The exposure method of claim 3, further comprising detecting a temperature of the mask after it has been preheated to the saturation point, and controlling the temperature of the mask based on the detected temperature so that the mask temperature will be maintained at the specific temperature.

11. The exposure method of claim 3, further comprising obtaining information pertaining to an amount of expansion of the preheated mask.

12. The exposure method of claim 11, further comprising projecting the mask pattern through a projection system onto the sensitive substrate, wherein the projection system is controlled based on the information pertaining to the amount of expansion.

13. A device manufacturing method, comprising manufacturing a device using an exposed sensitive substrate, wherein the exposed sensitive substrate has had a mask pattern transferred thereto according to the exposure method of claim 1.

14. An exposure apparatus for transferring a mask pattern, formed in a mask, to a sensitive substrate through an illumination of the mask by an exposure beam, comprising:
a heating apparatus to preheat the mask to a specific temperature to deform the mask before the illumination of the mask and to suppress deformation of the mask during the illumination of the mask; and
a controller to control the deformation of the mask by illuminating the mask with the exposure beam after the mask has reached a specific temperature, where the specific temperature is based on a saturation point, the saturation point being when a thermal expansion of the mask is saturated.

15. The exposure apparatus of claim 14, further comprising a calculation apparatus to obtain information pertaining to the saturation point based on an amount of energy that is applied to the mask by the illumination of the mask by the exposure beam.

16. The exposure apparatus of claim 14, further comprising a calculation apparatus to obtain information pertaining to the saturation point based on information pertaining to at least one of the mask pattern that is formed on the mask, an illumination area of the exposure beam on the mask, a reflectance of the mask, a transmittance of the mask, and a sensitivity of the sensitive substrate.

17. The exposure apparatus of claim 14, further comprising a calculation apparatus to calculate information pertaining to the saturation point based on a specific calculation formula.

18. The exposure apparatus of claim 14, further comprising:
 a memory to store measurement data for saturation points, the saturation points being measured before preheating the mask; and
 a control device to control the heater apparatus based on the measurement data stored in the memory.

19. The exposure apparatus of claim 16, wherein the heating apparatus preheats the mask to a temperature, based on the saturation point, by illuminating the mask with the exposure beam before the illumination of the mask by the exposure beam for the transferring of the mask pattern.

20. The exposure apparatus of claim 16, further comprising:
 a sensor to detect the temperature of the mask after it has been preheated to the saturation point; and
 a control apparatus electrically connected to the sensor to maintain the temperature of the mask at a temperature that depends on the saturation point, based on the detected temperature of the mask by the sensor.

21. The exposure apparatus of claim 16, further comprising a detection apparatus to detect information pertaining to an amount of expansion of the mask during preheating of the mask and during the illumination of the mask by the exposure beam.

22. The exposure apparatus of claim 21, further comprising a projection exposure apparatus to control a projection system based on information pertaining to the detected amount of expansion, where the projection exposure apparatus projects the mask pattern, through the projection system, onto the sensitive substrate.

23. A device manufacturing system to manufacture a device using an exposed sensitive substrate, where the exposed sensitive substrate is manufactured by the exposure apparatus of claim 14.

24. An exposure method, comprising:
 preheating a mask to a specific temperature that depends on a saturation point of the mask, the saturation point being a point at which a thermal expansion of the mask is saturated,
 transferring a mask pattern, formed on the mask, to a sensitive substrate through an illumination of the preheated mask by an exposure beam, with the preheated mask being maintained at the specific temperature.

25. The exposure method of claim 24, wherein the mask is preheated to the specific temperature to control a deformation of the mask during the transferring of the mask pattern.

26. The exposure method of claim 25, further comprising obtaining information pertaining to the saturation point based on an amount of energy that is applied to the mask by an illumination of the mask by the exposure beam.

27. The exposure method of claim 25, further comprising obtaining information pertaining to the saturation point based on a specific calculation formula or based on measurement data for the saturation point that was measured before preheating the mask.

28. The exposure method of claim 25, further comprising heating the mask using a heater.

29. The exposure method of claim 25, further comprising:
 detecting a preheated mask temperature; and
 controlling the preheated mask temperature to be at a temperature that depends on the saturation point, based on the detected preheated mask temperature.

30. The exposure method of claim 25, wherein the transferring of the mask pattern further comprises projecting the mask pattern through a projection system onto the sensitive substrate, obtaining information pertaining to an amount of expansion of the preheated mask, and controlling the projection system based on the obtained expansion information.

31. A device manufacturing method, comprising manufacturing devices using an exposed sensitive substrate, the exposed sensitive substrate being manufactured according to the exposure method of claim 24.

32. An exposure apparatus for transferring a mask pattern, formed in a mask, to a sensitive substrate by illuminating the mask with an exposure beam, comprising:
 a heating chamber, for holding a plurality of masks and heating a plurality of masks therein, before the transferring of the mask pattern of one of the plurality of masks to the sensitive substrate,
 wherein the heating chamber heats the mask to a specific temperature depending on a saturation point of the mask, the saturation point being a point at which a thermal expansion of the mask is saturated.

33. The exposure apparatus of claim 32, wherein the heating chamber is a mask library.

34. The exposure apparatus of claim 32, wherein the heating chamber heats the mask to a specific temperature that is higher than a saturation point of the mask.

35. The exposure apparatus of claim 32, further comprising a sensor to detect a temperature of the heating chamber.

36. A device manufacturing system, comprising an apparatus to manufacture devices using an exposed sensitive substrate, the exposed sensitive substrate being manufactured by the exposure apparatus of claim 32.

37. The exposure apparatus of claim 32, further comprising an estimating unit to estimate whether the mask has been heated to the specific temperature based on a heating time of the mask in the heating chamber.

38. A conveyance method for conveying a mask having a mask pattern, comprising:
 preheating the mask to a temperature that depends on a specific target temperature while the mask is being conveyed to a mask stage, with the mask stage being where the mask will be placed for a transferring of the mask pattern to the sensitive substrate,
 wherein the specific target temperature is a temperature based on a saturation point at which a thermal expansion of the mask is saturated.

39. The conveyance method of claim 38, wherein the mask is preheated to a temperature that is higher than the specific target temperature.

40. An exposure method for transferring a mask pattern onto a sensitive substrate, comprising illuminating a mask with an exposure beam, with the mask being conveyed to a mask stage according to the conveyance method of claim 38.

41. A device manufacturing method, comprising manufacturing a device using an exposed sensitive substrate, wherein the exposed sensitive substrate is manufactured according to the exposure method of claim 40.

* * * * *

UNITED STATES PATENT AND TRADEMARK OFFICE
CERTIFICATE OF CORRECTION

PATENT NO. : 6,342,941 B1
DATED : January 29, 2002
INVENTOR(S) : Masahiro Nei et al.

It is certified that error appears in the above-identified patent and that said Letters Patent is hereby corrected as shown below:

<u>Title page,</u>
Item [63], Related U.S. Application Data, change "Continuation-in-part of application No. 08/815,273, filed on Mar. 10, 1997, now abandoned, which is a continuation of application No. 08/995,809, filed Dec. 22, 1997, now abandoned" to -- Continuation of application No. 08/995,809, filed Dec. 22, 1997, now abandoned, which is a continuation-in-part of application No. 08/815,273, filed on Mar. 10, 1997, now abandoned. --

Signed and Sealed this

Twenty-third Day of April, 2002

*Attest:*

*Attesting Officer*

JAMES E. ROGAN
*Director of the United States Patent and Trademark Office*